(12) United States Patent
Zhu et al.

(10) Patent No.: US 9,318,344 B2
(45) Date of Patent: Apr. 19, 2016

(54) CMOS STRUCTURES AND METHODS FOR IMPROVING YIELD

(71) Applicant: International Business Machines Corporation, Armonk, NY (US)

(72) Inventors: Huilong Zhu, Poughkeepsie, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/556,732

(22) Filed: Dec. 1, 2014

(65) Prior Publication Data

US 2015/0087121 A1   Mar. 26, 2015

Related U.S. Application Data

(60) Division of application No. 11/757,792, filed on Jun. 4, 2007, now Pat. No. 8,901,662, which is a continuation-in-part of application No. 11/380,695, filed on Apr. 28, 2006, now Pat. No. 7,521,307.

(51) Int. Cl.
| H01L 29/78 | (2006.01) |
| H01L 21/311 | (2006.01) |
| H01L 21/8238 | (2006.01) |

(52) U.S. Cl.
CPC .. *H01L 21/31116* (2013.01); *H01L 21/823807* (2013.01); *H01L 21/823864* (2013.01); *H01L 21/823871* (2013.01); *H01L 29/7843* (2013.01)

(58) Field of Classification Search
CPC ............ H01L 21/31116; H01L 29/7843; H01L 21/823807
See application file for complete search history.

(56) References Cited

U.S. PATENT DOCUMENTS 3,602,841 A    8/1971  McGroddy
4,665,415 A    5/1987  Esaki et al.
(Continued)

FOREIGN PATENT DOCUMENTS

JP       6476755          3/1989
JP       08111457 A  *   4/1996
(Continued)

OTHER PUBLICATIONS

Rim et al., "Transductance Enhancement in Deep Submicron Strained-Si n-MOSFETs", International Electron Devices Meeting, IEEE, 1998, 26.8.1-26.8.4.
(Continued)

*Primary Examiner* — Alexander Sofocleous
*Assistant Examiner* — Sun M Kim
(74) *Attorney, Agent, or Firm* — Scully, Scott, Murphy & Presser, P.C.; Steven J. Meyers

(57) ABSTRACT

A simple, effective and economical method to improved the yield of CMOS devices using contact etching stopper liner, including, single neutral stressed liner, single stressed liner and dual stress liner (DSL), technology is provided. In order to improve the chip yield, the present invention provides a method in which a sputter etching process is employed to smooth/flatten (i.e., thin) the top surface of the contact etch stopper liners. When DSL technology is used, the inventive sputter etching process is used to reduce the complexity caused by DSL boundaries to smooth/flatten top surface of the DSL, which results in significant yield increase. The present invention also provides a semiconductor structure including at least one etched liner.

13 Claims, 13 Drawing Sheets

(56) References Cited

U.S. PATENT DOCUMENTS

| | | | |
|---|---|---|---|
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,322,806 A * | 6/1994 | Kohno et al. | 438/573 |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,372,664 B1 | 4/2002 | Jang et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,475,895 B1 | 11/2002 | Mei et al. | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,573,172 B1 | 6/2003 | En et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,929,992 B1 | 8/2005 | Djomehri et al. | |
| 6,974,981 B2 | 12/2005 | Chidambarrao et al. | |
| 6,977,194 B2 | 12/2005 | Belyansky et al. | |
| 6,982,465 B2 | 1/2006 | Kumagai et al. | |
| 7,015,082 B2 | 3/2006 | Doris et al. | |
| 7,101,744 B1 | 9/2006 | Dyer et al. | |
| 7,105,394 B2 | 9/2006 | Hachimine et al. | |
| 7,148,559 B2 | 12/2006 | Chan et al. | |
| 7,187,038 B2 * | 3/2007 | Morin et al. | 257/369 |
| 7,205,615 B2 | 4/2007 | Tsutsui et al. | |
| 7,220,630 B2 * | 5/2007 | Cheng et al. | 438/199 |
| 7,288,451 B2 * | 10/2007 | Zhu et al. | 438/228 |
| 7,297,584 B2 | 11/2007 | Park et al. | |
| 7,361,539 B2 | 4/2008 | Chen et al. | |
| 7,514,370 B2 | 4/2009 | Yang et al. | |
| 7,585,720 B2 | 9/2009 | Sudo | |
| 7,612,414 B2 | 11/2009 | Chen et al. | |
| 7,615,432 B2 | 11/2009 | Kim et al. | |
| 7,750,414 B2 | 7/2010 | Zhu et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0113174 A1 | 6/2004 | Chidambarrao et al. | |
| 2004/0113217 A1 | 6/2004 | Chidambarrao et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0214998 A1 | 9/2005 | Chen et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0079046 A1 | 4/2006 | Yang et al. | |
| 2006/0228848 A1 | 10/2006 | Chan et al. | |
| 2007/0020838 A1 * | 1/2007 | Zhu et al. | 438/199 |
| 2007/0096220 A1 | 5/2007 | Kim et al. | |
| 2008/0087965 A1 | 4/2008 | Chen et al. | |

FOREIGN PATENT DOCUMENTS

| | | |
|---|---|---|
| JP | 200360076 A | 2/2003 |
| JP | 200386708 A | 3/2003 |
| JP | 2003273240 A | 9/2003 |
| JP | 20055633 A | 1/2005 |
| JP | 200680161 A | 3/2006 |
| JP | 2006173432 A | 6/2006 |
| JP | 2007208166 A | 8/2007 |
| WO | WO2005057631 A2 | 6/2005 |

OTHER PUBLICATIONS

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

(56) References Cited

OTHER PUBLICATIONS

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15, 2003.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "SiGe HBT Technology with Fmax/Ft = 350/300 GHz and Gate Delay Below 3.3 ps", IEEE, 2004.

Bean et al., "$GE_x Si_{1-x}/Si$ Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si—Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for $Si_{1-x}Ge_x$ Strained Layers on (100) Si", Appl. Phys. Lett., 1990, pp. 460-462, vol. 56, No. 29.

Ouyang et al., "Two-Dimensional Bandgap Engineering in a Novel Si/SiGe pMOSFET With Enhanced Device Performance and Scalability," IEEE, 2000, pp. 151-154.

Huilong Zhu et al., "Improving Yields of High Performance 65 nm Chips With Sputtering Top Surface of Dual Stress Liner", IBM System & Technology Group at IBM Semiconductor Research and Development Center (SRDC), Hopewell Junction, NY 12533.

Yang, H. S., et al., Dual Stress Liner for High Performance sub-45nm Gate Length SOI CMOS Manufacturing, IEEE, 2004, pp. 28.8.1-28.8.3.

Leobandung, E., et al., "High Performance 65 nm SOI Technology with Dual Stress Liner and Low Capacitance SRAM Cell", Symposium on VLSI Technology Digest of Technical Papers, 2005, pp. 126-127.

\* cited by examiner

CMOS STRUCTURES AND METHODS FOR IMPROVING YIELD

FIELD OF THE INVENTION

The present invention relates to semiconductor structures and methods of fabricating the same. More particularly, the invention relates to semiconductor structures and methods that provide mechanical stress within complementary metal oxide semiconductor (CMOS) structures to enhance device performance and improve chip yield.

BACKGROUND OF THE INVENTION

CMOS structures comprise complementary mated pairs of field effect transistors of differing conductivity type. Due to the use of complementary mated pairs of differing conductivity type, CMOS structures also provide for reduced energy or power consumption.

A trend within CMOS fabrication is the use of stressed layers as a means to produce a mechanical stress or strain field within a channel region of a CMOS transistor; the channel region of a CMOS transistor is typically located within a semiconductor substrate beneath the gate conductor. Certain types of mechanical stresses are desirable insofar as they introduce a stress into a semiconductor channel. Such a stress generally provides for enhanced charge carrier mobilities within a CMOS transistor. Complementary types of channel stress (i.e., tensile or compressive stress or strain in the direction of electrical current) enhance complementary types of charge carrier mobility (i.e., electron or hole) within complementary types of CMOS transistors (i.e., nFET or pFET).

Since mechanical stress is a significant factor that may considerably improve field effect transistor performance, CMOS structures and methods that provide for enhanced levels of mechanical stress within CMOS transistor channels are desirable.

Methods for improving charge carrier mobility within CMOS structures that include pFET and nFET devices are known in the semiconductor fabrication art. For example, dual stress liner (DSL) technology has been demonstrated as an efficient and economical method to enhance CMOS device performance in 90 nm and 65 nm semiconductor-on-insulator (SOI) technology; see, for example, U.S. Patent Application Publication No. 2005/0093030 A1 to Doris et al., H. S. Yang et al., IEDM 2004, p. 1075 and E. Leobandung et al. VLSI 2005, p. 126-127.

At the DSL boundary, it is preferred to have an overlap area between the tensile and compressive nitride liners in order to obtain good protection for the underlying devices. However, with aggressive scaling of contacted gate pitch, it becomes more difficult to deal with DSL boundaries, especially for etching contact-to-active-area (CA) holes. For example, the DSL overlap could be located on a polygate gate-landing pad that connects the nFET and pFET gates together (e.g., an inverter) or near source/drain (S/D) contact areas. In this case, it is required that the two stress nitride liners (i.e., tensile and compressive liners) have to be etched through during later CA hole etching.

In addition to the above, current technology provides a large aspect ratio between the height of the gate liner top and the pitch of the gate electrode which makes it difficulty to etch a contact hole by reactive ion etching due to thickness variation in the interlevel dielectric material.

Another example is related to DSL overlap that is on the top of a dummy gate. The dummy gate is widely used to improve gate patterning and is located on a shallow trench isolation (STI) region between neighboring nFETs and pFETs. Usually, resistance of the S/D contact areas near the dummy gate is very sensitive to the misalignment of the DSL boundaries in 65 nm technology.

It will become even more difficult to deal with DSL boundaries when CMOS technology scales down to 45 nm and beyond due to tighter CMOS ground rules. Therefore, it would be desirable to provide methods and CMOS structures in which the negative impact of DSL boundaries can be minimized without degrading CMOS performance and causing an area penalty.

SUMMARY OF THE INVENTION

The present invention provides a simple, effective and economical method to improve the yield of CMOS devices using contact etch stopper liner, including neutral stressed liner, single stressed liner and DSL, technology. In order to improve the chip yield, the present invention provides a method in which a sputter etching process is employed to smooth/flatten (i.e., thin) the top surface of the stressed (neutral, single and dual) liner(s). When DSL technology is used, the inventive sputter etching process is used to reduce the complexity caused by DSL boundaries to smooth/flatten the top surface of the DSL, which results in significant yield increase. For example, the inventive method can be used to increase the yield of a 36 Mb 0.65 $\mu m^2$ static random access memory (SRAM) cell by 25%. The inventive method also increases the yield for dual-core microprocessors by 33% and for single-core microprocessors by 75%.

In addition to improving the chip yield, the inventive sputter etching process can also be used to reduce interlevel dielectric thickness variation and to reduce the thickness of the overlap area in a DSL-containing structure which, in turn, reduces the difficulty in contact hole etching. A further benefit of the inventive method is that the sputter etching process can be used to control the final shape of the stressed liner that is located on the top of the gate. In embodiments in which a dummy gate is located on an isolation region, the inventive sputter etching process can be used to trim the tips on the active boundaries between the nFET and pFET device regions.

To thin or reduce DSL overlap, a physical sputtering process (i.e., a sputter etching process) is conducted in the present invention prior to deposition of an interlevel dielectric material. Sputtering yield, the mean number of target atoms removed per incident particle, is dependent on properties of both the target material and incident particle, such as the target surface topography and the particle's incident angle and kinetic energy. Usually DSL overlap and gate top areas have larger sputtering yield than flat areas such as shallow trench isolation and S/D (i.e., source and drain). Therefore, sputtering can be used to reduce the size of the DSL overlap without significantly changing DSL films in shallow trench isolation and S/D regions. This can reduce the difficulty for a contact area hole etch since the amount of stressed liners that has to be etched during the contact formation is reduced.

In one aspect of the present invention, the method of the present invention includes:

forming a first transistor of a first polarity laterally separated from a second transistor of a second polarity different than the first polarity over a semiconductor substrate;

forming at least one stressed layer having a stress located over the first transistor and the second transistor, said at least one stressed layer having a deposited thickness over the first and second transistors; and sputter etching said at least one stressed layer to provide at least one etched stressed layer that has an etched thickness over the first and second transistors that is less than said deposited thickness, wherein said at least one etched stressed layer over each of said first and second transistors has tapered surface sidewalls that meet each other.

In one embodiment, the at least one stressed layer is a single stressed layer. The single stressed layer may include any stressed material such as a nitride or oxynitride, with nitrides, such as silicon nitride being highly preferred. The stress of the single stressed layer can be compressive or tensile.

In the present invention, the tapered surface sidewalls of the stressed layer(s) meet each other typically forming an inverted V-shape. The inverted V-shape stressed layer(s) can be located atop the first transistor, the second transistor or both the first and second transistor.

In another embodiment, the at least one stressed layer comprises a first stressed layer of a first stress located over the first transistor and a second stressed layer of a second stress, different from the first stress, located over the second transistor, wherein said first and second stressed layers abut and overlap each other in an area located between said first and second transistors and the overlap stressed layers have an overlap thickness. Sputter etching provides a first etched stressed layer over the first transistor and a second etched stressed layer over the second transistor in which the etched thickness over both the transistors is less than the deposited thickness, and each of the etched stressed layers over said first and second transistors has tapered surface sidewalls which meet each other typically forming an inverted V-shape over the transistors. In this embodiment, sputter etching also reduces the overlap thickness and forms an etched surface in the overlap area that has tapered surface sidewalls, which meet each other typically forming an inverted V-shape over the overlap area.

In some embodiments of the present invention, the foregoing method further includes forming an interlevel dielectric material having contact vias located therein over the semiconductor substrate including the first and second transistors and the etched stressed layer(s).

In another embodiment of the present invention, a stressed neutral layer is formed atop the etched stressed layer(s) prior to forming the interlevel dielectric material having the contact vias.

In another aspect of the present invention, sputter etching can be used to trim the tips of the n-active and p-active boundary to improve the contact area etch and yield. This aspect of the present invention includes:

forming a first transistor of a first polarity laterally separated from a second transistor of a second polarity different from the first polarity over a semiconductor substrate, wherein at least one dummy gate is located on a surface of an isolation region in said substrate between said first and second transistors;

forming a first stressed layer having a first stress located over the first transistor and a second stressed layer having a second stress different from the first stress located over the first and second transistors, said second stressed layer having a deposited thickness over the second transistor, where the first stressed layer and the second stressed layer abut and overlap each other in an area between the first and second transistors defining an overlap area having an overlap thickness; and selectively sputter etching said second stressed layer over said second transistor to provide an etched second stressed layer having an etched thickness that is less than said deposited thickness over the second transistor and said etched second stressed layer over said second transistor has tapered surface sidewalls that meet each other, and wherein said overlap thickness is reduced and said etched second stressed layer in said overlap area has tapered surface sidewalls that also meet each other.

In the above method, the tapered surface sidewalls of the stressed layer(s) over both the transistors and the overlap area meet each other typically forming an inverted V-shape stressed layer(s) over the transistors and the overlap area.

In addition to the above methods, the present invention also provides semiconductor structures that can be formed from the above methods. Common to each structure is that the sputter etching process provides tapered sidewall surfaces, which meet each other typically providing an inverted V-shaped stressed layer atop each of the transistors present in the structure. When DSL-technology is used, the etched stressed layers in the overlap area also have an inverted V-shape.

In one aspect, a semiconductor structure is provided that comprises:

a first transistor of a first polarity laterally separated from a second transistor of a second polarity different than the first polarity over a semiconductor substrate; and at least one etched stressed layer over said first and second transistors, said at least one etched stressed layer over the first and second transistors has tapered surface sidewalls that meet each other.

In the present invention the tapered surface sidewalls of the stressed layer(s) meet each other typically forming an inverted V-shape. The inverted V-shape can be located atop the first transistor, the second transistor or both the first and second transistor. When DSL technology is used the etched stressed layers over the overlap area also have tapered surface sidewalls that meet each other typically forming an inverted V-shaped etched stressed material in the overlap region.

In one embodiment, the at least one stressed layer is a single stressed layer. The single stressed layer may include any stressed material such as a nitride or oxynitride, with nitrides, such as silicon nitride being highly preferred. The stress of the single stressed layer can be compressive or tensile.

In another embodiment, the at least one etched stressed layer comprises a first etched layer of a first stress located over the first transistor and a second etched stressed layer of a second stress, different from the first stress, located over the second transistor. In this embodiment, the etched stressed layers abut and overlap each other in an area located between said first and second transistors. In this embodiment, the first etched stressed layer over the first transistor and the second etched stressed layer over the second transistor each has tapered surface sidewalls that meet each other typically forming an inverted V-shape and etched stressed layers in the overlap area have tapered surface sidewalls which meet each other typically forming another inverted V-shape.

In another aspect of the present invention, a semiconductor structure is provided that includes:

a first transistor of a first polarity laterally separated from a second transistor of a second polarity different from the first polarity over a semiconductor substrate, wherein at least one dummy gate is located on a surface of an isolation region in said substrate between said first and second transistors;

a first stressed layer having a first stress located over the first transistor; and an etched second stressed layer having a second stress different from said first stress over the second transistor, said etched second stressed layer over said second transistor has tapered surface sidewalls that meet each other, and wherein said first stressed layer and said second etched stressed layer abut and overlap each other in an area over the dummy gate, wherein said, etched second stressed layer in said overlap area has tapered surface sidewalls that meet each other.

DETAILED DESCRIPTION OF THE INVENTION

Figure 1:
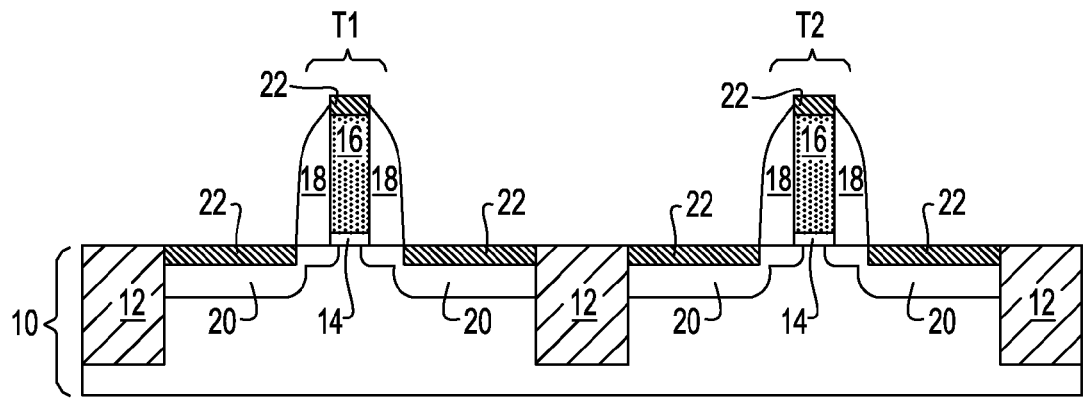
FIGS. 1-4B are pictorial representations through various cross sections illustrating the basic processing steps employed in a first embodiment of the present invention.

The present invention, which provides CMOS structures and methods for fabrication thereof that include complementary stressed layers that are smoothed/flatten by a sputter etching process, is described in further detail within the context of the description below. The description below is understood within the context of the drawings described above. Since the drawings are intended for illustrative purposes, they are not necessarily drawn to scale.

In the drawings, the letter "A" denotes a cross sectional view crossing the gate electrode lines, while the letter "B" denotes a cross sectional view along the gate electrode lines. When no "A" or "B" designation is used in the drawings, the cross sectional view is also crossing the gate lines.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides methods for improving the chip yield for CMOS devices in which contact etch stopper liners are employed to provide etch stopper protection of devices and stressed channels. The inventive methods utilize a sputter etching process to smooth/trim the top surface of the etch stopper liner avoiding the problems discussed in the background section of the present invention.

Reference is first made to FIGS. 1-4B which are pictorial representations through various cross sectional views illustrating basic processing steps of a first embodiment of the present invention.

Specifically, FIG. 1 shows a semiconductor substrate 10 that comprises active regions separated by an isolation region 12. A first transistor T1 is located upon one active region and a second transistor T2 is located upon an adjacent active region. Transistors T1 and T2 are of different polarity (i.e., conductivity type) and thus the doping type in each of active regions is different. The transistors T1 and T2 comprise gate dielectrics 14 located upon the active regions of the semiconductor substrate 10. Gate electrodes 16 are aligned upon gate dielectrics 14, although such alignment is not a requirement of the invention. At least one spacer 18 adjoins each of the gate electrodes 16. Source/drain regions 20 are located within the active regions of the semiconductor substrate and separated by channel regions located beneath the gate electrodes 16. Metal semiconductor alloy layers 22, e.g., a metal silicide or a metal germanide, are located upon the source/drain regions 20 and the gate electrodes 16.

Each of the foregoing semiconductor substrate 10, layers and structures may comprise materials and have dimensions that are conventional in the semiconductor fabrication art. Each of the foregoing semiconductor substrate 10, layers and structures may be formed using methods that are conventional in the semiconductor fabrication art.

The semiconductor substrate 10 comprises a semiconductor material. Non-limiting examples of semiconductor materials from which may be comprised the semiconductor substrate 10 include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The embodiments and the invention contemplate that the semiconductor substrate 10 may comprise a bulk semiconductor substrate. Alternatively, the embodiment and the invention also contemplates that the semiconductor substrate 10 may comprise a semiconductor-on-insulator substrate. As a further alternative, the embodiments and the invention also contemplate that the semiconductor substrate may comprise a hybrid orientation substrate.

A semiconductor-on-insulator substrate comprises a base semiconductor substrate, a buried dielectric layer located thereupon and a surface semiconductor layer located further thereupon. A hybrid orientation substrate comprises a semiconductor substrate having multiple crystallographic orientations that may provide different crystallographic orientation channel regions for each transistor within a CMOS structure.

Semiconductor-on-insulator substrates and hybrid orientation substrates may be formed using any of several layer lamination methods and layer transfer methods. The foregoing substrates may also be formed using separation by implantation of oxygen (Separation-by-implantation-of-oxygen or SIMOX) methods.

The isolation regions 12 comprises a dielectric isolation material. The embodiments and the invention contemplate that isolation regions 12 may comprise shallow trench isolation regions, deep trench isolation regions and, to a lesser extent, local oxidation of silicon isolation regions. The dielectric isolation material from which is comprised the isolation regions 12 may comprise an oxide, a nitride and/or an oxynitride of silicon. Oxides, nitrides and oxynitrides of other elements are not excluded as dielectric isolation materials.

Dielectric isolation materials may be formed using methods including, but not limited to: thermal or plasma oxidation or nitridation methods, chemical vapor deposition methods and physical vapor deposition methods. Typically, each of the isolation regions 12 is formed at least in part from a silicon oxide dielectric isolation material that has a thickness from about 100 to about 50000 angstroms, where the thickness is highly dependent upon the use of a SOI or a bulk semiconductor substrate.

The gate dielectrics 14 may comprise generally conventional gate dielectric materials having a dielectric constant from about 4 to about 20, measured in vacuum. Such generally conventional gate dielectric materials may include, but are not limited to: oxides, nitrides and oxynitrides of silicon. They may be formed using methods analogous or identical to those disclosed above with respect to forming the isolation regions 12. Alternatively, the gate dielectrics 14 may also comprise generally higher dielectric constant dielectric materials having a dielectric constant from about 20 to at least about 100, also measured in a vacuum. These generally higher dielectric constant dielectric materials may include, but are not limited to: hafnium oxides, hafnium silicates, titanium oxides, lanthanum oxides, barium-strontium titantates (BSTs) and lead-zirconate titantates (PZTs). Typically, the gate dielectrics 14 comprise a thermal silicon oxide gate dielectric material having a thickness from about 5 to about 70 angstroms.

The gate electrodes 18 comprise gate electrode conductor materials. Typical gate electrode conductor materials include certain metals, metal alloys, metal nitrides and metal silicides, as well as polysilicon and silicon germanium materials. The gate electrode conductor materials may be formed using methods including, but not limited to: plating methods, chemical vapor deposition methods (including atomic layer chemical vapor deposition methods) and physical vapor deposition methods (including sputtering methods). Typically, the gate electrodes 18 comprise a metal, metal silicide or polysilicon gate electrode conductor material having a thickness from about 200 to about 1500 angstroms.

In should be emphasized that the gate dielectric and the gate electrode in the two device regions shown may comprise the same dielectric material and/or conductive material, or they may comprise different dielectric and/or conductive materials.

The at least one spacer 18 comprises any insulating material including oxides, nitrides, oxynitrides and combinations and multilayers thereof. The at least one spacer 18 is formed by a conventional deposition process, followed by etching.

The source/drain regions 20 are formed using a two step ion implantation method. A first step within the two step ion implantation method uses the gates 16, absent the at least one spacer 18, as a mask to form extension regions and, as needed, a halo profile into the semiconductor substrate 10. A second step within the two step ion implantation method uses the gates 16 and the at least one spacer 18 as a mask to form conductor region portions of the source/drain regions 20 into the semiconductor substrate. Thus, the source/drain regions 20 comprise extension region components and conductor region components. Dopant concentrations within the source/drain regions 20 range from about $1 \times 10^{20}$ to about $3 \times 10^{21}$ dopant atoms per cubic centimeter.

The metal semiconductor alloy layers 22 comprise the semiconductor material of the substrate 10 and any of several metal semiconductor alloy forming metals. Non-limiting examples of metal semiconductor alloy forming metals include titanium, tungsten, nickel, cobalt, vanadium and molybdenum. The metal semiconductor alloy layers 22 are typically formed using a self-aligned silicide (i.e., salicide) method that provides for: (1) a blanket metal semiconductor alloy forming metal layer deposition; (2) a subsequent thermal annealing to provide for metal semiconductor alloy formation in contact with the semiconductor substrate 10; and (3) a subsequent excess metal semiconductor alloy forming metal layer stripping. Typically, each of the metal semiconductor alloy layers 22 has a thickness from about 50 to about 500 angstroms. In a preferred embodiment of the present invention, the metal semiconductor alloy layers 22 are silicides of one of the above mentioned metal semiconductor alloy forming metals.

Figure 2A:
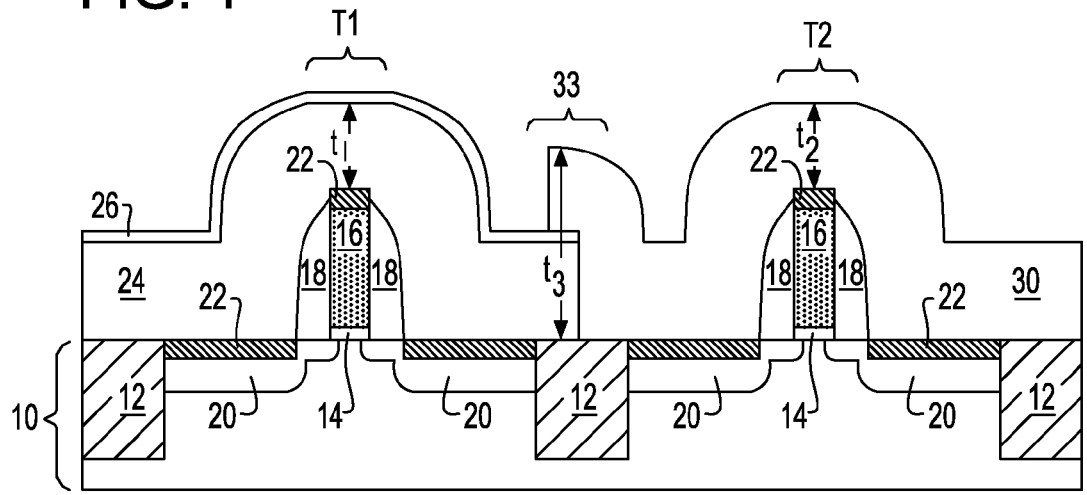
Figure 2B:
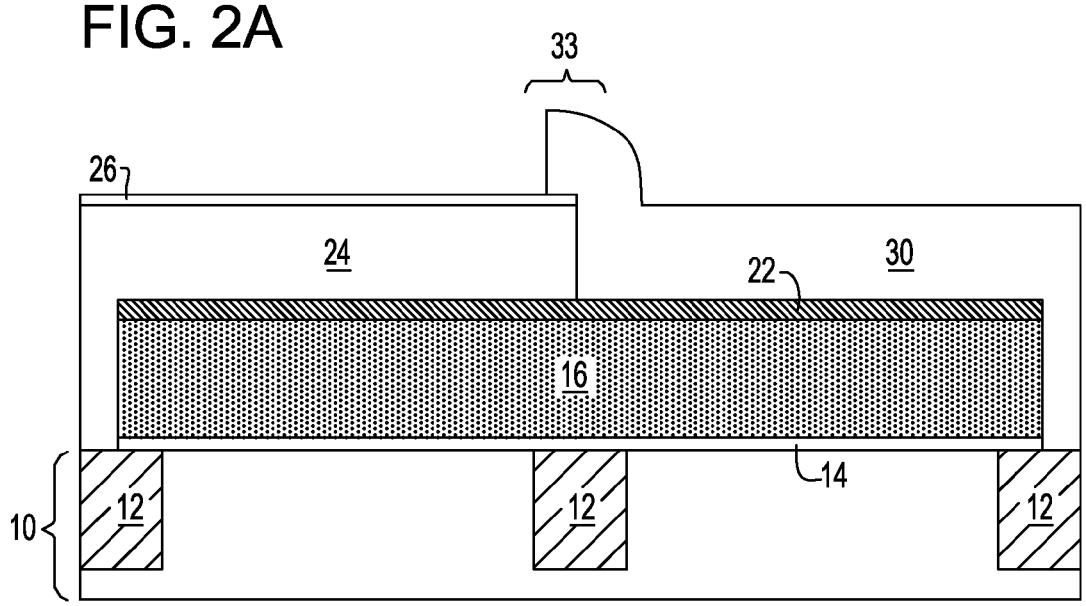

FIGS. 2A and 2B (cross sectional view through the gate conductor line) show a first stressed layer 24 located upon the active area including T1 and an etch stop layer 26 located upon the first stressed layer 24. FIG. 2 also shows a second stressed layer 30 located upon the active area including T2.

The first stressed layer 24 comprises a material that has a first stress intended to compliment and enhance performance of the first transistor T1. When the first transistor T1 is an nFET, the first stress is preferably a tensile stress that provides a tensile stress within the channel of the first transistor T1 in the source/drain direction. Under those circumstances, an electron charge carrier mobility within the first transistor T1 is enhanced. Conversely, when the first transistor is a pFET, a compressive stress of an overlying layer is desirable for purposes of generating compressive channel stress in the source/drain direction that yields an enhanced hole mobility.

Within the instant embodiment, the first transistor T1 is preferably an nFET and the first stressed layer 24 preferably comprises a tensile stressed layer.

The first stressed layer 24 may comprise any of several stressed materials. Non-limiting examples includes nitrides and oxynitrides. Nitrides are particularly common stressed layer materials insofar as different magnitudes and types of stress may be introduced into a nitride layer material by using different deposition conditions for forming the nitride layer. Particular deposition conditions that affect nitride layer stress include a changing of the ratio of a low frequency plasma to a high frequency plasma at a temperature range from about 200° C. to about 600° C.

Typically, the first stressed layer 24 comprises a nitride material that has a deposited thickness from about 300 to about 1500 angstroms, although the invention is not limited to stressed layers comprising only nitride materials. The deposited thickness of the first stressed layer 24 over the first transistor is designed by $t_1$ in FIG. 2A.

The etch stop layer 26 may comprise any of several etch stop materials. Etch stop materials will typically have a different composition from the first stressed layer 24. Typically, the etch stop layer 26 comprises an oxide etch stop material when the first stressed layer 24 comprises a nitride material. Within the instant embodiment, the etch stop layer 26 typically comprises a silicon oxide etch stop material that has a thickness from about 50 to about 300 angstroms. The etch stop layer 26 may be formed using methods analogous to the methods used for forming the isolation region 12.

It is noted that the first stressed layer 24 and the etch stop layer 26 are first formed over the entire structure shown in FIG. 1 including both active regions and thereafter the blanket layers are patterned to provide the structure shown in FIGS. 2A-2B. The patterning includes first forming a block mask located upon the etch stop layer 26 and covering the first transistor T1. The block mask may comprise any of several mask materials. Non-limiting examples include hard mask materials and photoresist mask materials. Photoresist mask materials are considerably more common. Non-limiting examples of photoresist mask materials include positive photoresist materials, negative photoresist materials and hybrid photoresist materials. Typically, the block mask comprises a photoresist material having a thickness from about 1000 to about 5000 angstroms.

After block mask formation, an etching step is then employed to form corresponding the etch stop layer 26 and first stressed layer 24 within the active region including T1. The block mask is present during the etching process and it serves as an etch mask. The foregoing etching is typically undertaken while using a plasma etchant, although neither the embodiment nor the invention is so limited. Wet chemical etchants, while generally less common, may also be used. Typically, the plasma etchant uses a fluorine containing etchant gas composition for etching each of the etch stop layer 26 and the first stressed layer 24 when forming therefrom the structures shown in FIGS. 2A-2B.

After etching the etch stop layer and the first stressed layer, the block mask is stripped from the CMOS structure using methods and materials that are otherwise conventional in the semiconductor fabrication art. Included are wet chemical stripping methods and materials, dry plasma stripping methods and materials and aggregate stripping methods and materials thereof. Dry plasma stripping methods and materials are particularly common, but do not limit the invention.

A blanket layer of the second stressed layer 30 is then formed over the entire structure in both active regions. The second stressed layer 30 has an appropriate stress engineered to promote enhanced performance (generally within the context of charge carrier mobility) of the second transistor T2. The second stressed layer 30 may comprise materials and have dimensions that are analogous, equivalent or identical to the materials and dimensions used for forming the first stressed layer 24. In FIG. 2A, the as deposited thickness of second stressed layer over T2 is designed as $t_2$. As is disclosed above, the first stressed layer 24 typically comprises a silicon nitride material whose stress (i.e., tensile or compressive) may be engineered incident to control of particular deposition conditions. The second stressed layer 30 thus also comprises a nitride material, but for which deposition conditions are selected to have a type of stress (i.e., tensile or compressive) typically opposite the first stressed layer 24.

Within the context of the instant embodiment, the first stressed layer 24 preferably comprises a tensile stress from about 500 MPa to about 4 GPa (when the first transistor T1 is an nFET) and the second stressed layer 30 preferably a compressive stress from about −500 MPa to about −5 GPa (when the second transistor T2 is a pFET).

Next, another block mask is formed upon the second stressed layer 30 and covering the second transistor T2. The block mask comprises materials and has dimensions analogous or equivalent to the first block mask mentioned above.

With the second block mask in place, the second stressed layer 30 is patterned to remove the second stressed layer 30 from the active region including T1. After the patterning step, the second block mask is stripped (as described above) to form the structure shown in FIGS. 2A-2B. The second stressed layer 30 may be etched while using methods and materials analogous equivalent or identical to the methods and materials used for etching the first stressed layer 24

As is illustrated within FIGS. 2A and 2B, the first stressed layer 24 and the second stressed layer 30 abut and overlap each other. The overlap area (which is labeled as reference numeral 33) in the drawings is typically located atop the isolation region 12 that is located between T1 and T2. The thickness of the overlap area 33 shown in FIG. 2A is labeled as $t_3$. The labels $t_1$, $t_2$ and $t_3$ have been omitted from FIG. 2B for clarity.

After patterning the second stressed layer 30, the block mask is removed from the structure providing the structure shown in FIGS. 2A-2B.

Figure 3A:
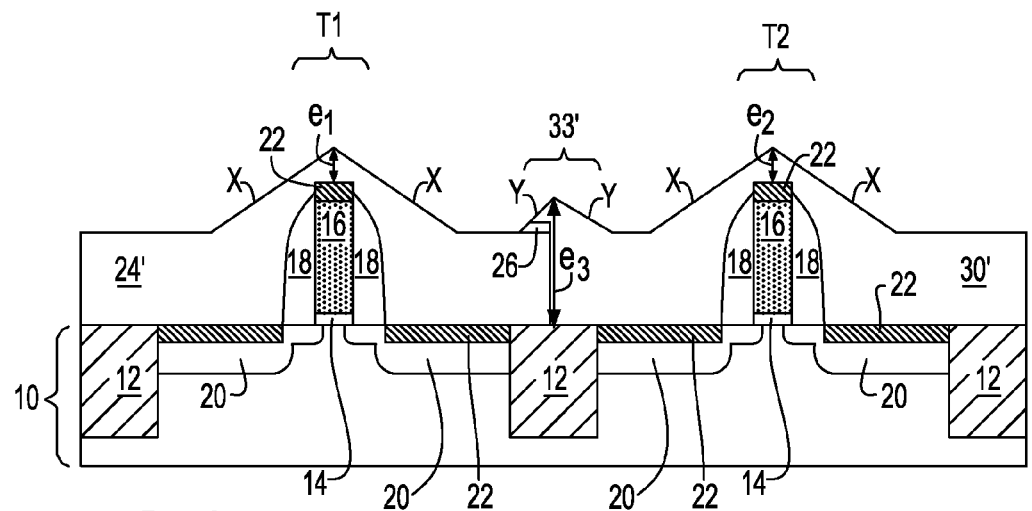
Figure 3B:
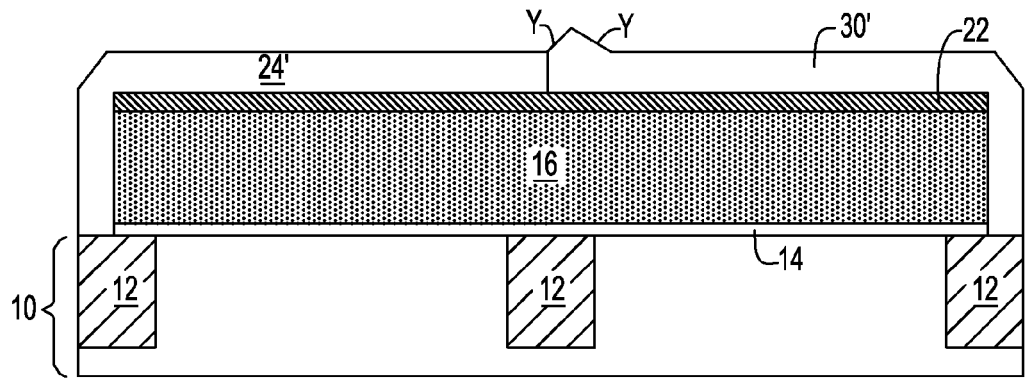

Next, a sputter etching process (i.e., a physical sputtering process) is performed on the structure shown in FIGS. 2A-2B to provide the structure shown in FIGS. 3A-3B. Specifically, the sputter etching process removes exposed portions of the etch stop layer 26, while flattening and smoothing the first stressed layer 24 and the second stressed layer 30 into a first etched stressed layer 24' and a second etched stressed layer 30'. The sputter etching step removes more from the top surfaces of the first stressed layer 24 and the second stressed layer 30 than lower surfaces thereof and as such the first etched stressed layer 24' and second etched stressed layer 30' each have a thickness over their corresponding transistor that is less than the thickness of the first stressed layer 24 and the second stressed layer 30 over the transistors. The labels $e_1$ and $e_2$ are used in FIG. 3A to designate the etch thickness of the etched stress layers over each of the transistors.

In particular, the sputter etching process reduces the thickness of the stressed layer(s) in areas directly over T1 and T2 as well as in the area in which subsequent contact vias will be formed and filled with a conductive material. Additionally, and when DSL are used, as in the present embodiment, the sputter etching process reduces the size of the overlap area between the first and second stressed layers.

These differences can be clearly seen by comparing the resultant structure shown in FIGS. 3A-3B with that of FIGS. 2A-2B. In a conventional DSL process flow, FIGS. 2A-2B would be used as the structure in which the contact vias are formed.

The etch stop layer 26 located in the overlap area 33 is not removed by this sputter etching process. However, and as stated above the size of the overlap area 33' after the sputter etch is less than the overlap area 33 prior to this etching step. In FIG. 3A, label $e_3$ designates the reduced thickness in the etched overlap area 33'.

It is also noted that the each of the etched stressed layers over the transistors has tapered surface sidewalls X that meet each other typically, but not necessarily always, forming an inverted V-shape, while the etched overlap area 33' also has tapered surface sidewalls Y that meet each other also typically, but not necessarily always, forming an inverted V-shape.

The sputter etching process of the present invention is performed in a plasma that includes a noble gas and $N_2$. The noble gas may comprise He, Ar, Xe and mixtures thereof. Preferably, the noble gas is Ar. The sputter etching process bombards the stressed layers with energetic ions of noble gases, often $Ar^+$, and $N^{2+}$ which knock atoms from the stressed layers by transferring momentum. Because the etching is performed by ions, which approach the stressed layers approximately from one direction, this process is highly anisotropic The sputter etching process is typically performed at a temperature from about 200° C. to about 600° C., with a temperature from about 300° C. to about 500° C. being even more typical. The sputter etching process is performed at a plasma power (based on a high frequency bias power in a HDP-CVD system) from about 800 Watts to about 3000 Watts, with a plasma power from about 1500 Watts to about 2500 Watts being even more typical. Moreover, the sputtering etching process is performed at a pressure from about 1 to about 20 mTorr, with a pressure from about 2 to about 5 mTorr being even more typical.

Figure 4A:
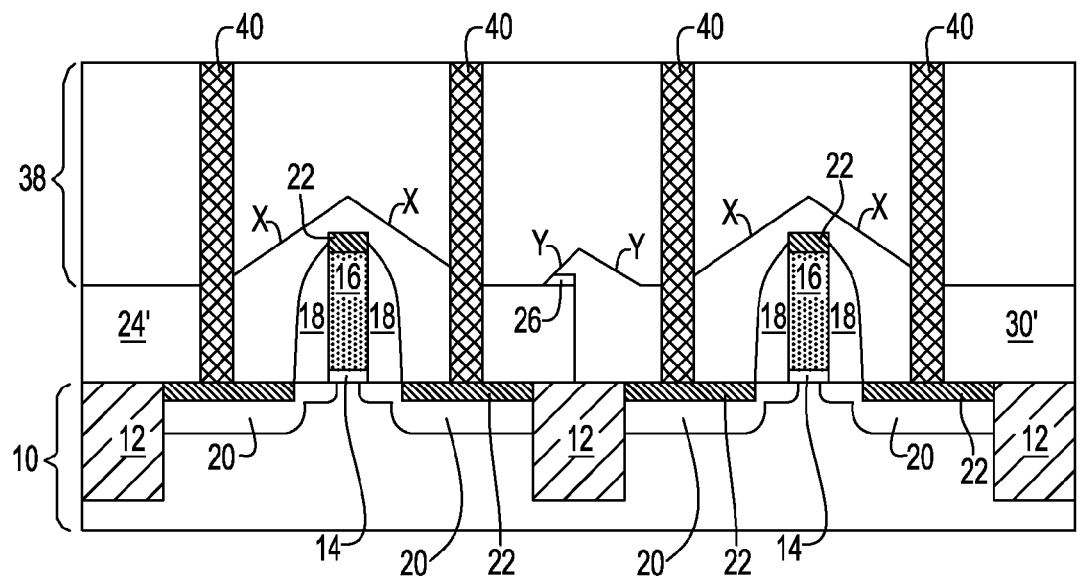
Figure 4B:
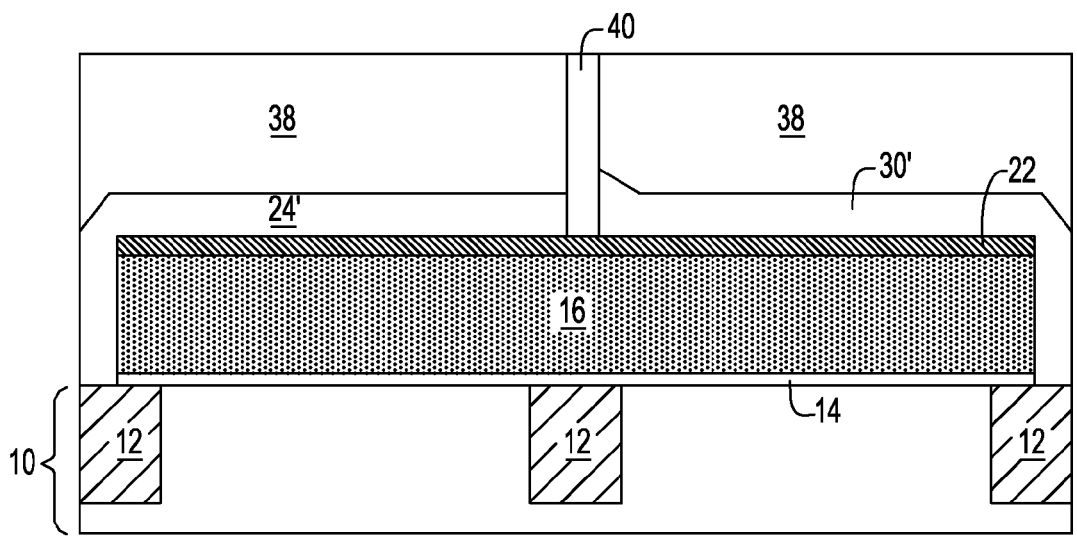

FIGS. 4A-4B illustrate the structure after forming an interlevel dielectric material 38 over the structure shown in FIGS. 3A-3B and after forming contact vias 40 within the interlevel dielectric 38. The interlevel dielectric material 38 is formed utilizing any conventional deposition process including, but not limited to: chemical vapor deposition (CVD), low pressure chemical vapor deposition (LPCVD), plasma enhanced chemical vapor deposition (PECVD), sub-atmospheric chemical vapor deposition (SACVD), evaporation, chemical solution deposition, and spin-on-coating. The interlevel dielectric material 38 includes any conventional dielectric material such as, for example, silicon dioxide, a silicate glass, a silsesquioxane, an organosilicate that includes atoms of Si, C, O and H, and a thermosetting polyarylene ether. The term "polyarylene" is used to denote aryl moieties that are linked together by bonds, fused rings, or inert linking groups such as, for example, oxygen, sulfur, sulfone, sulfoxide, carbonyl and the like. A planarization process such as, for example, chemical mechanical polishing and/or grinding is then used to form a coplanar structure.

The contact vias 40 are then formed into the interconnect level dielectric material 38 utilizing lithography, etching and filling the etched vias with a conductive material such as, for example, W, TiN, Al, Cu and Al—Cu. These steps of contact via formation are well known to those skilled in the art and, as such, details concerning such processing is not described herein so as not to obscure the present invention.

FIGS. 4A-4B shows a CMOS structure in accordance with a first embodiment of the invention. The CMOS structure comprises complementary first etched stressed layer 24' located upon first transistor T1 and second etched stressed layer 30' located upon second transistor T2. The complementary first etched stressed layer 24' and etched second stressed layer 30' overlap at a location interposed between the first transistor T1 and the second transistor T2. The size of the etched overlap region 33' is smaller than that for a structure prepared utilizing a conventional DSL process. Additionally, the first etched stressed layer 24' and the second etched stressed layer 30' are smoother and thinner as compared to that of a conventional DSL-containing CMOS structure. That is, the first and second etched stressed layers (24' and 30', respectively) have an etched thickness over their corresponding transistor that is less than the thickness of the deposited and non-etched stressed layers. Also, each of the etched stressed layers over the transistor have tapered surface sidewalls X that meet each other typically forming an inverted V-shape. Similarly, the etched overlap area 33' has tapered surface sidewalls Y that meet each other typically forming an inverted V-shape in that area of the structure as well.

FIGS. 5A-6B are pictorial representations through various cross sections illustrating the basic processing steps in accordance with a second embodiment of the invention. The second embodiment of the present invention begins by first providing the structure which is shown in FIGS. 3A-3B of the first embodiment. After providing the structure shown in FIGS. 3A-3B, a stressed neutral layer 42 is formed on the exposed surfaces of the first etched stressed layer 24' and the second etched stressed layer 30' providing the structure shown, for example, in FIGS. 5A-5B. By "stressed neutral layer" it is meant, that the layer does not have a positive stress value or a negative stress value associated therewith. The stressed neutral layer 42 is formed utilizing one of the methods used above in forming the first and second stressed layers (24 and 30, respectively). The stressed neutral layer 42 is comprised of one of the materials mentioned above for the first stressed layer 24 and the second stressed layer 30. Preferably, the stressed neutral layer 42 comprises a silicon nitride material. The thickness of the stressed neutral layer 42 is from about 50 to about 200 angstroms. The presence of the stressed neutral layer 42 protects the CMOS from any possible exposure to an interlevel dielectric material.

Figure 5A:
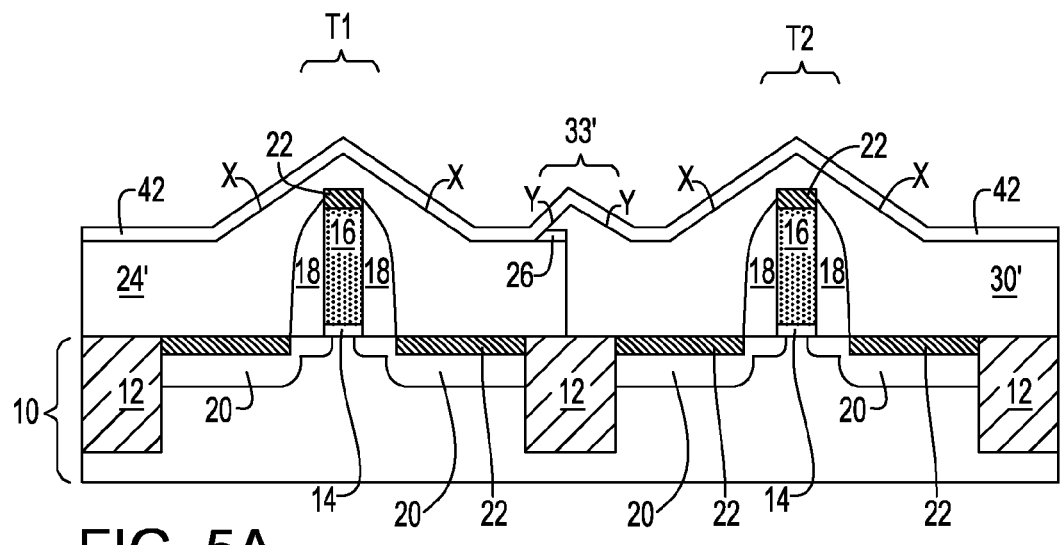
FIGS. 5A-6B are pictorial representations through various cross sections illustrating the basic processing steps employed in a second embodiment of the present invention.
Figure 5B:
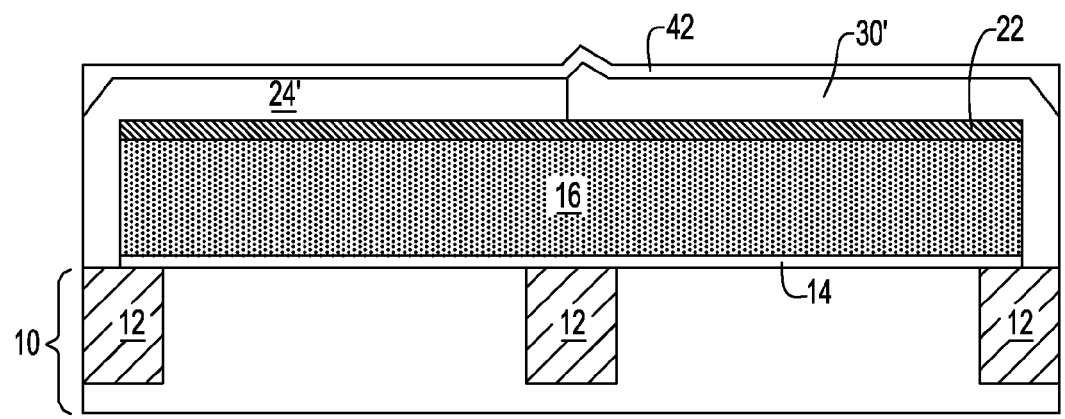
Figure 6A:
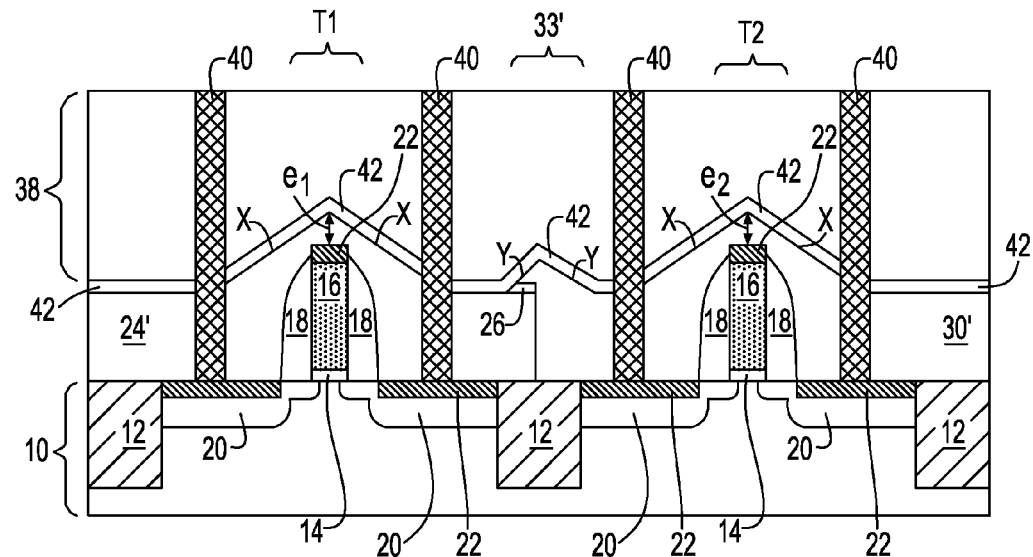
Figure 6B:
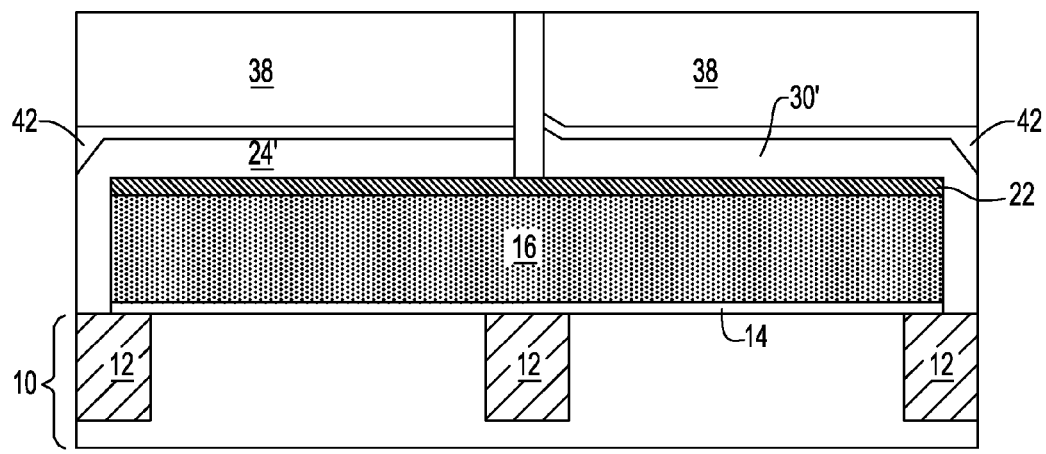

FIGS. 6A-6B shows the structure of FIGS. 5A-5B after formation of an interlevel dielectric material 38 and contact vias 40 within the interlevel dielectric material 38. The composition and processing steps forming the interlevel dielectric material 38 and contact vias 40 are as described above.

FIGS. 6A-6B shows a CMOS structure in accordance with a second embodiment of the invention. The CMOS structure comprises complementary first etched stressed layer 24' located upon first transistor T1 and second etched stressed layer 30' located upon second transistor T2. The complementary first etched stressed layer 24' and second etched stressed layer 30' overlap at a location interposed between the first transistor T1 and the second transistor T2. The size of the etched overlap region 33' is smaller than that for a structure prepared utilizing a conventional DSL process. Additionally, the first etched stressed layer 24' and the second etched stressed layer 30' are smoother and thinner as compared to that of a conventional DSL-containing CMOS structure. That is, the first and second etched stressed layers (24' and 30', respectively) have an etched thickness over their corresponding transistor that is less than the thickness of the deposited and non-etched stressed layers. Also, each of the etched stressed layers over the transistor have tapered surface sidewalls X that meet each other typically forming an inverted V-shape. Similarly, the etched overlap area 33' has tapered surface sidewalls Y that meet each other typically also forming an inverted V-shape in that area of the structure as well. A stressed neutral layer 42 is located upon both the first etched stressed layer 24' and the second etched stressed layer 30'.

Figure 7A:
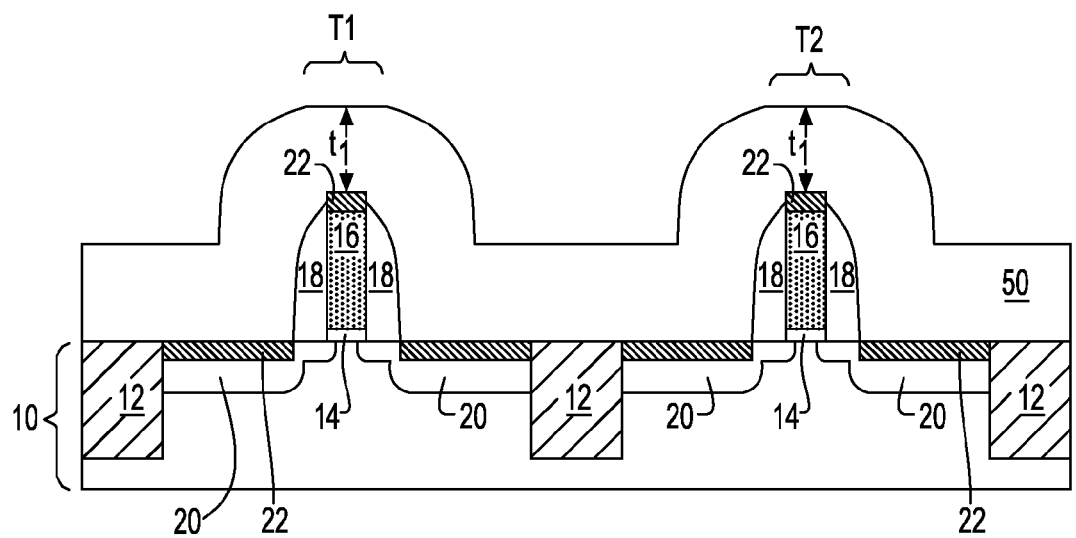
FIGS. 7A-9B are pictorial representations through various cross sections illustrating the basic processing steps employed in a third embodiment of the present invention.
Figure 7B:
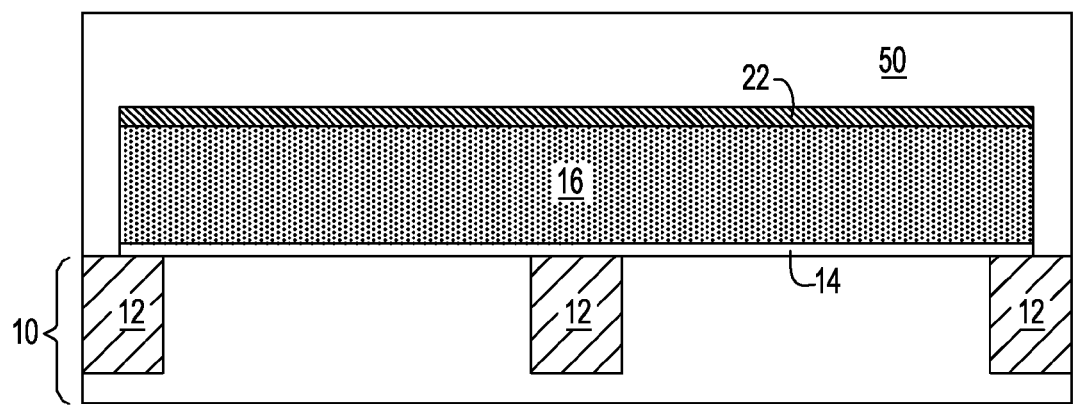

FIGS. 7A-9B are pictorial representations through various cross sections illustrating the basic processing steps in accordance with a third embodiment of the invention. The third embodiment of the present invention begins by first providing the structure which is shown in FIG. 1 of the first embodiment. After providing the structure shown in FIG. 1, a single stressed layer 50 is formed over the entire structure providing the structure shown, for example, in FIGS. 7A-7B. In FIG. 7A, the label $t_1$ is illustrated to show the deposited thickness of the single stressed layer 50 over each of the transistors. The single stressed layer 50 comprises any of several stressed materials or stressed neutral materials (i.e., materials having no stress). Non-limiting examples includes nitrides and oxynitrides. Nitrides are particularly common stressed layer materials insofar as different magnitudes and types of stress may be introduced into a nitride layer material by using different deposition conditions for forming the nitride layer. Particular deposition conditions that affect nitride layer stress include a changing of the ratio of a low frequency plasma to a high frequency plasma at a temperature range from about 200° C. to about 600° C.

Typically, the single stressed layer 50 comprises a nitride material that has a thickness from about 200 to about 1500 angstroms, although the invention is not limited to stressed layers comprising only nitride materials. The single stressed layer 50 may have a compressive stress or a tensile stress.

Figure 8A:
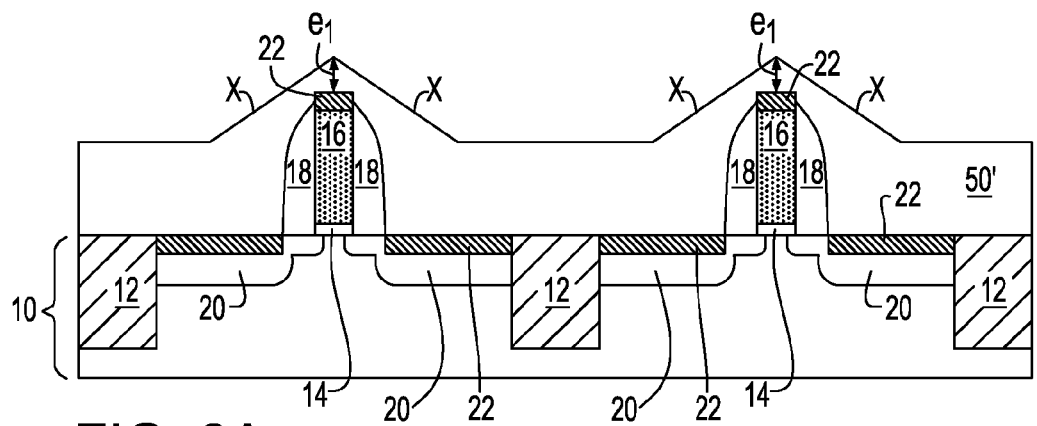
Figure 8B:
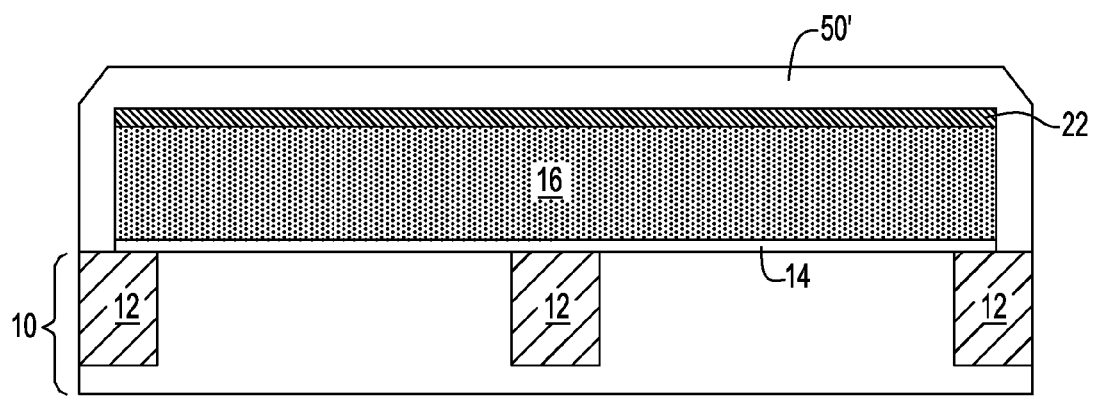

FIGS. 8A-8B show the resultant structure that is formed after performing a sputter etching process. Specifically, sputter etching (as described above) is used to smooth and flatten the single stressed layer 50 into an etched single stressed layer 50'. The etched stressed layer 50' has an etched thickness $e_1$ over each transistor that is less than the thickness of the deposited and non-etched stressed layer. Also, the etched stressed layer over each of the transistors has tapered surface sidewalls X that meet each other typically forming an inverted V-shape.

Figure 9A:
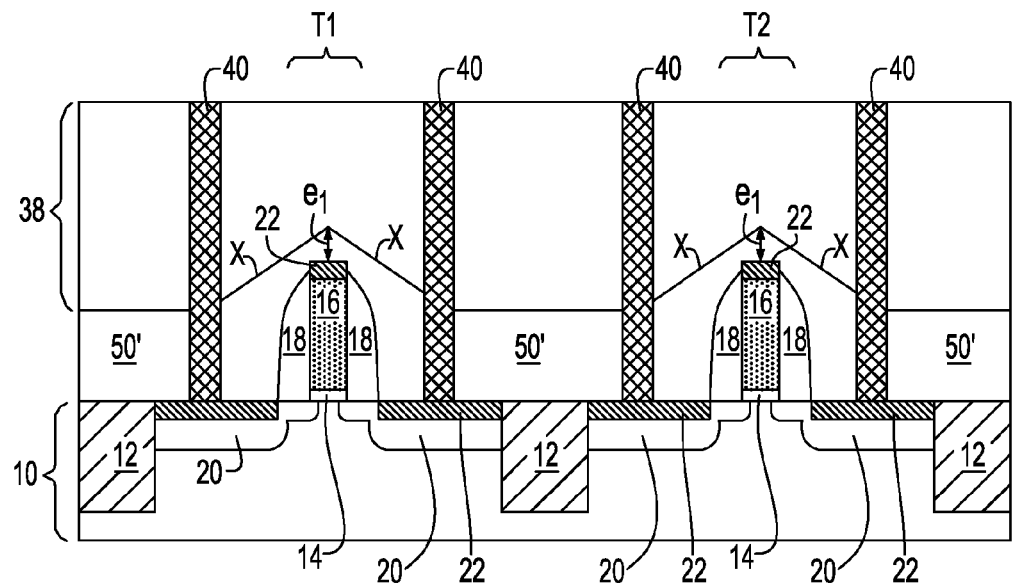
Figure 9B:
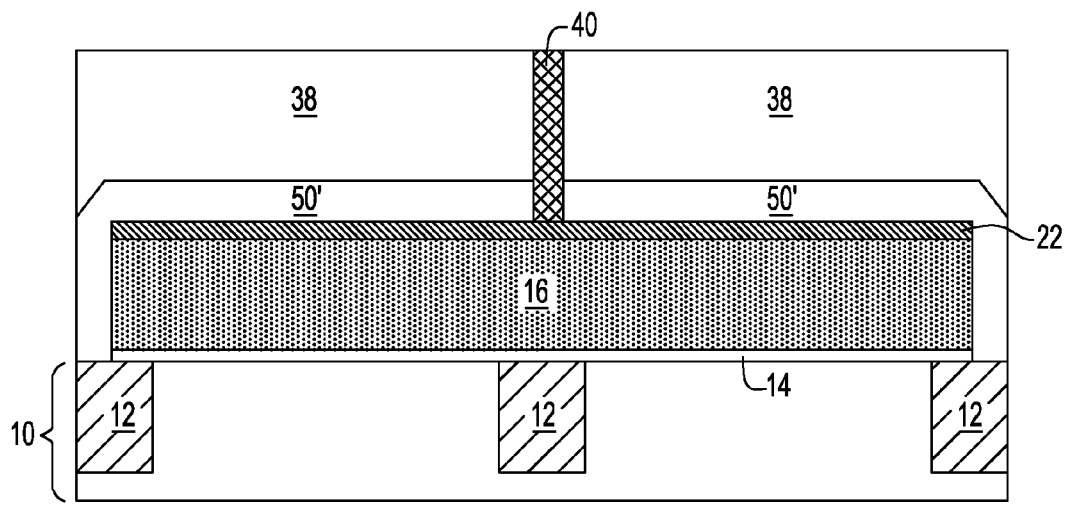
Figure 10A:
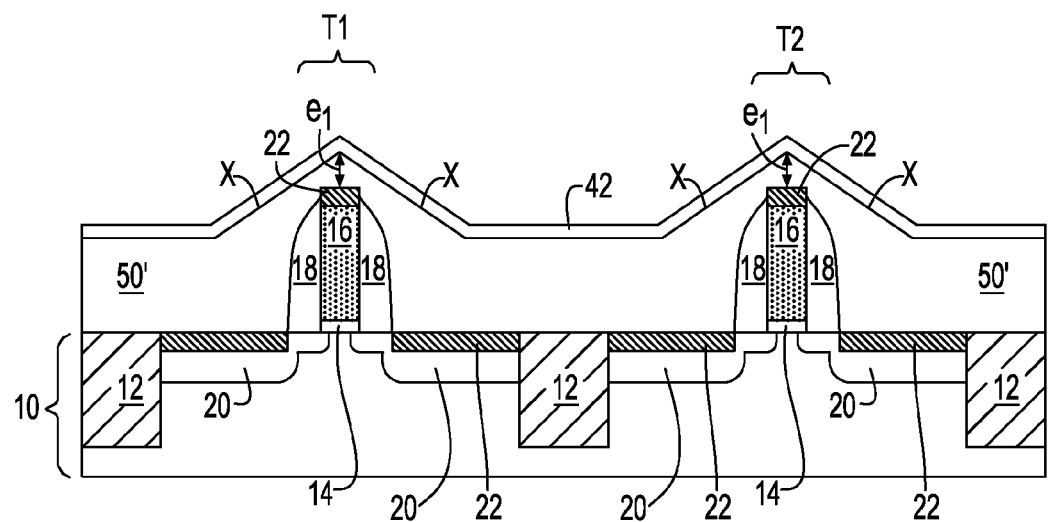
FIGS. 10A-11B are pictorial representations through various cross sections illustrating the basic processing steps employed in a fourth embodiment of the present invention.
Figure 10B:
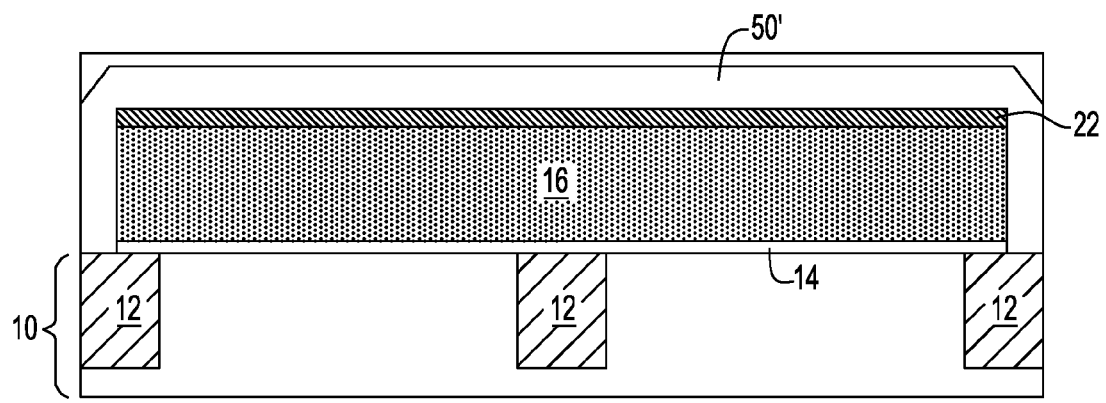

FIGS. 9A-9B illustrate the resultant structure that is formed after forming an interlevel dielectric material 38 having contact vias 40 located therein. The details regarding composition and method of fabricating the interlevel dielectric material 38 and contact vias 40 are the same as described above in the first embodiment of the present invention.

FIGS. 9A-9B illustrate the structure in accordance with a third embodiment of the present invention. Specifically, the structure includes a single etched stressed layer 50' located upon the first transistor T1 and the second transistor T2. The single etched stressed layer 50' is smoother and thinner as compared to that of a conventional single stress liner-containing CMOS structure. That is, the etched stressed layer 50' has an etched thickness over the transistors that is less than the thickness of the deposited and non-etched stressed layers. Also, the etched stressed layer 50' over each of the transistors has tapered surface sidewalls X that meet each other typically forming an inverted V-shape.

FIGS. 10A-11B are pictorial representations through various cross sections illustrating the basic processing steps in accordance with a fourth embodiment of the invention. The fourth embodiment of the present invention begins by first providing the structure which is shown in FIGS. 8A-8B of the third embodiment. After the sputter etching process that is used to form the structure shown in FIGS. 8A-8B, a neutral stressed layer 42 is formed over the single stressed layer 50' providing the structure shown in FIG. 10-10B. The neutral stressed layer 42 and method of fabricating the same are as described above in the second embodiment of the present invention.

Figure 11A:
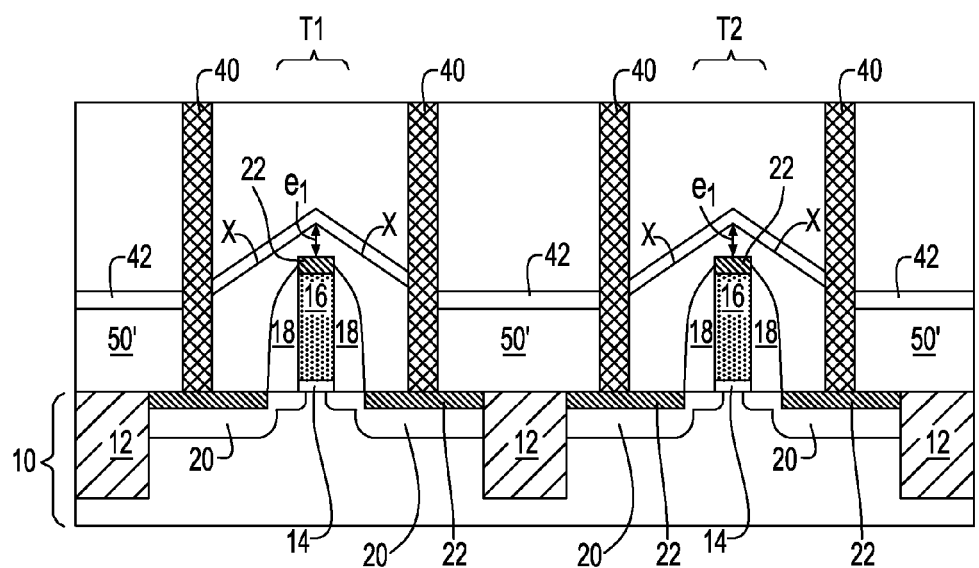
Figure 11B:
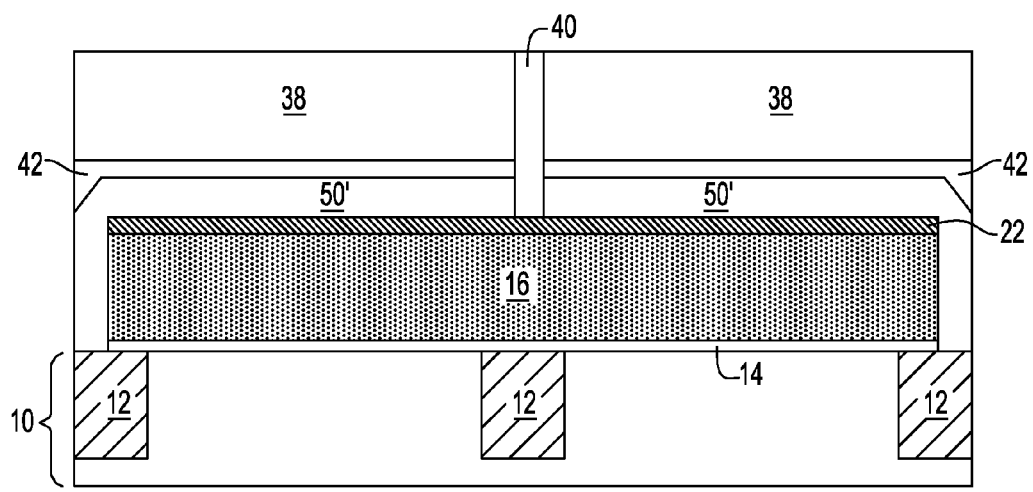

FIGS. 11A-11B illustrate the resultant structure that is formed after forming an interlavel dielectric material 38 having contact vias 40 located therein. The details regarding composition and method of fabricating the interlevel dielectric material 38 and contact vias 40 are the same as described above in the first embodiment of the present invention.

FIGS. 11A-11B illustrate the resultant CMOS structure in accordance with the fourth embodiment of the present invention. The structure includes a single etched stressed layer 50' located upon the first transistor T1 and the second transistor T2. The single etched stressed layer 50' is smoother and thinner as compared to that of a conventional single stress liner-containing CMOS structure. That is, the etched stressed layer 50' has an etched thickness over the transistors that is less than the thickness of the deposited and non-etched stressed layers. Also, the etched stressed layer 50' over each of the transistors has tapered surface sidewalls X that meet each other typically forming an inverted V-shape. A neutral stressed layer 42 is located on an upper surface of the single stressed layer 50'.

Figure 12:
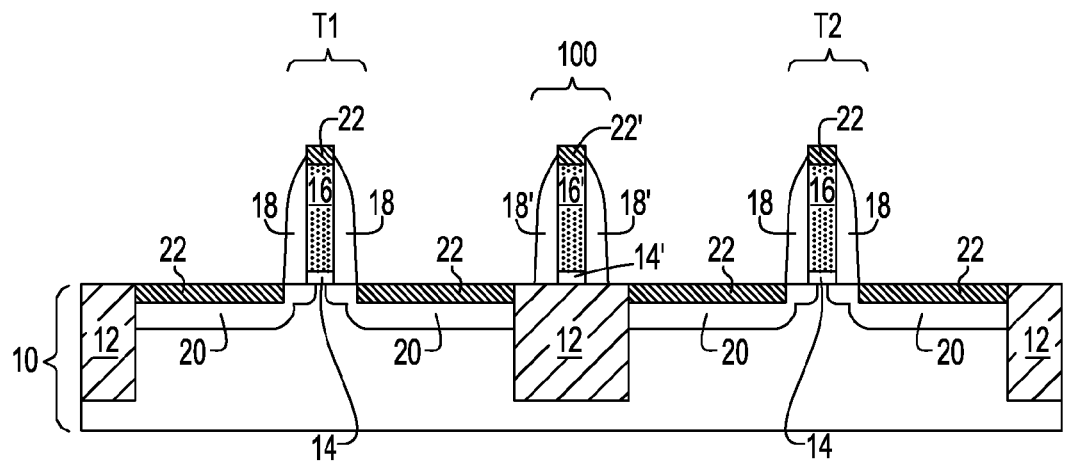
FIGS. 12-16 are pictorial representations through various cross sections illustrating the basic processing steps employed in a fifth embodiment of the present invention.

Reference is now made to FIGS. 12-16 which are pictorial representations through various cross sections illustrating the basic processing steps employed in a fifth embodiment of the present invention. The fifth embodiment is different from the first, second and third embodiments in that a dummy gate 100 is located on the isolation region 12 that is located between the first and second active regions including T1 and T2. The dummy gate 100 includes the same elements as that of T1 and T2 except that no source/drain regions are present underneath the gate and no metal semiconductor alloy region is located at the footprint of the gate. Thus, dummy gate 100 includes a gate dielectric 14', gate conductor 16' including a metal semiconductor alloy 22' and at least one spacer 18'. The dummy gate 100 which is shown in FIG. 12 is used to obtain good control of pattern effects.

Figure 13:
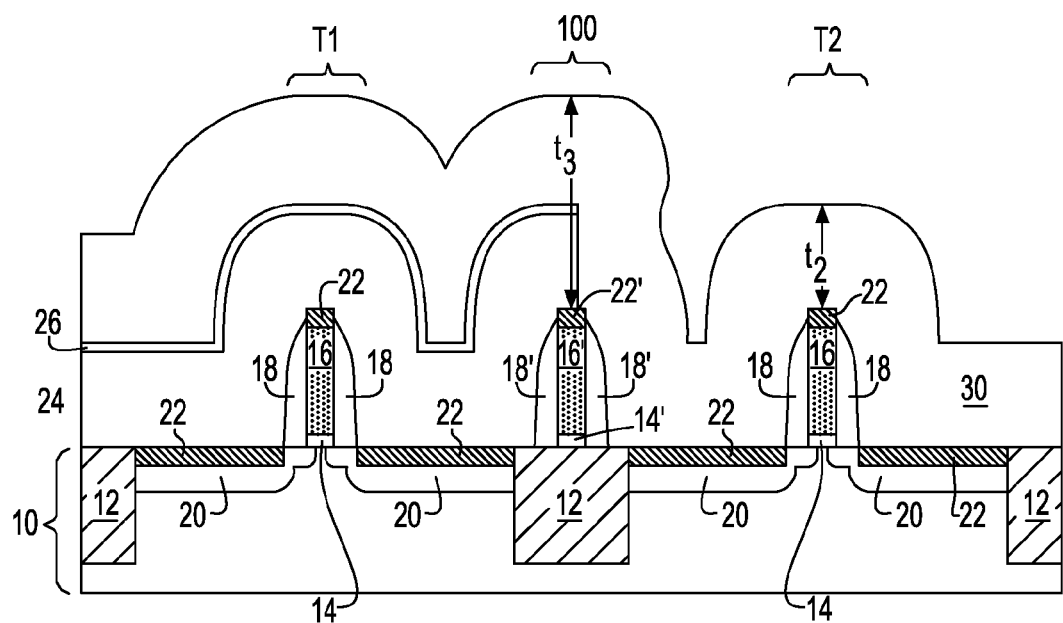

FIG. 13 illustrates the structure that is formed after forming the first stressed layer 24, the etch stop layer 26 and the second stressed layer 30; $t_2$ is used in the drawing to denote the as deposited thickness of second stressed layer 30 over T2 and $t_3$ is used to denote the thickness of the stressed layers of the dummy gate 100. The materials and processes for fabricating each of the layers is the same as that mentioned above in the first embodiment of the present invention. Note that the second stressed layer 30 exists as a blanket layer in this embodiment of the present invention instead of a patterned layer as shown and described above for the first embodiment of the present invention.

Figure 14:
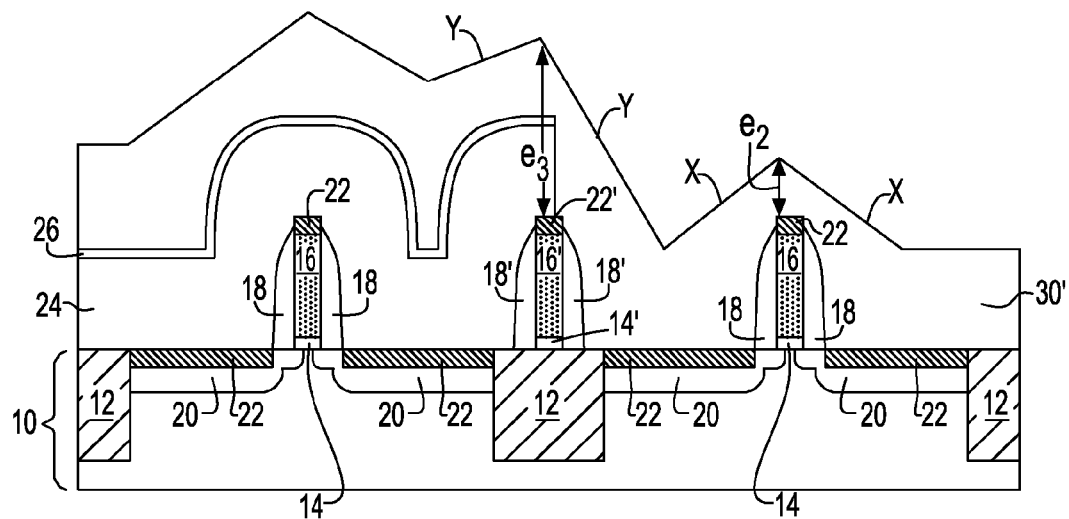

FIG. 14 illustrates the structure that is formed after performing a sputter etching process on the blanket layer of the second stressed layer 30 providing a second etched stressed layer 30'. The details concerning the sputter etch are the same as described above. Note that the etched stressed layer 30' has an etched thickness over the transistors that is less than the thickness of the deposited and non-etched stressed layers. Also, the etched stressed layer 30' over dummy gate 100 has tapered surface sidewalls Y that meet each other typically forming an inverted V-shape.

Figure 15:
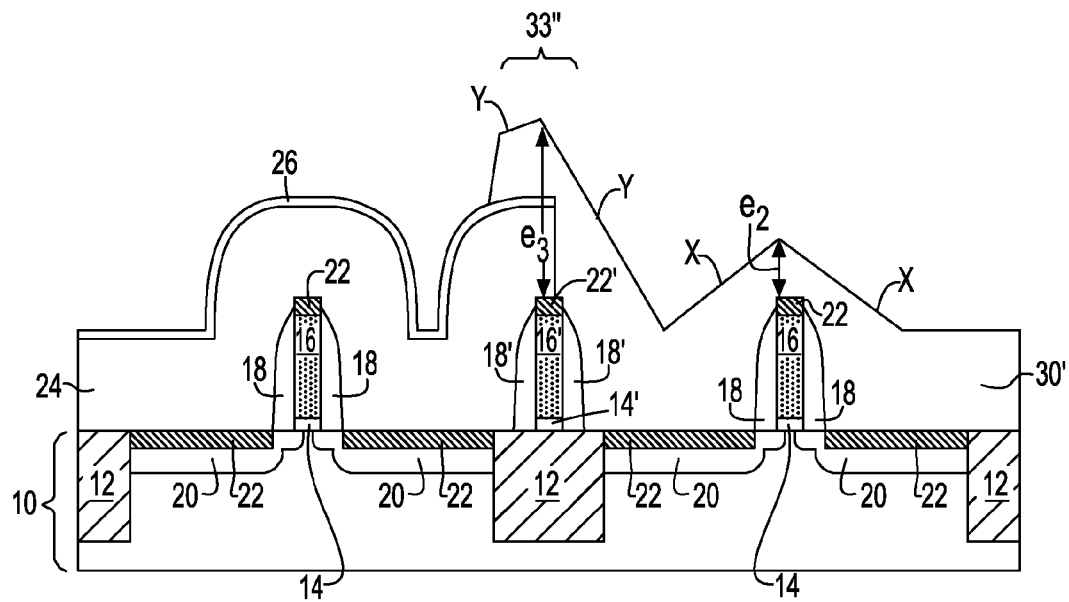

FIG. 15 shows the structure after removing the second etched stressed layer 30' from the first active region including T1. An etched overlap region 33" exists in the proximity of the dummy gate as is shown in FIG. 15. The second stressed layer 30' is removed by first providing a block mask covering at least the second active area including T2, etching the exposed second stressed layer 30' from the first active including T1 and removing the block mask. The processing details as the same as described above in the first embodiment of the invention.

Figure 16:
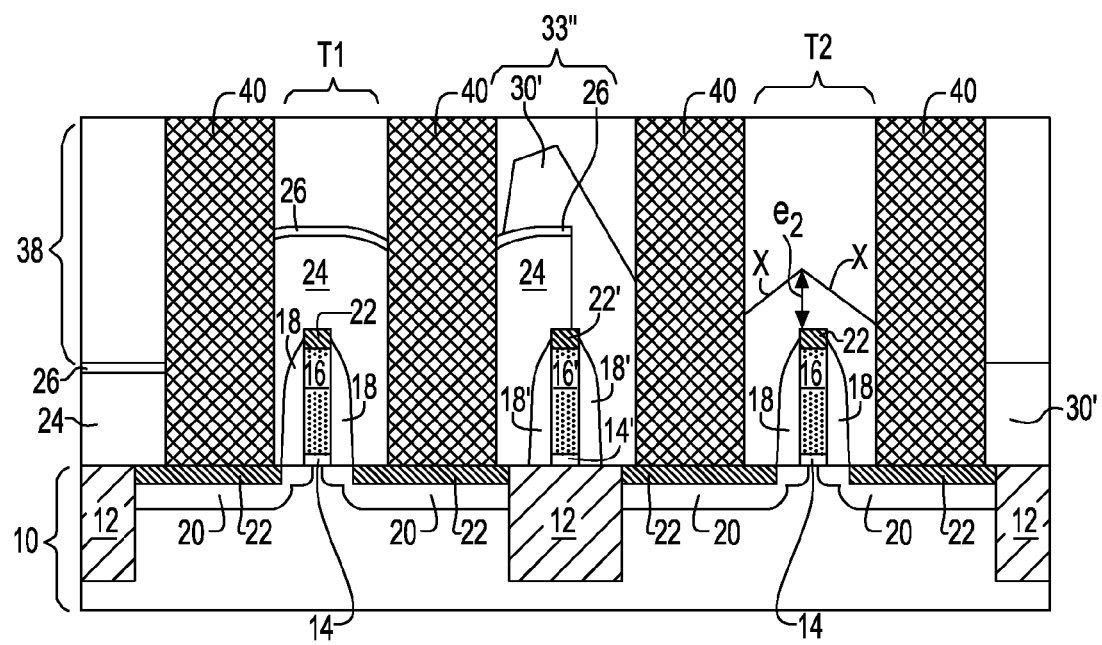

FIG. 16 shows the structure after formation of an interlevel dielectric material 38 which has contact vias 40 located therein. The interlevel dielectric material and contact vias 40 comprise the same materials as described above and the same processing steps as described above are employed in forming the same.

It is noted that this embodiment of the present invention can also include a stressed neutral liner as described above. It is further noted that the formation of an inverted V-shaped stressed liner is dependent upon the conditions of the sputter etching process used.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   forming a first transistor of a first polarity laterally separated from a second transistor of a second polarity different than the first polarity over a semiconductor substrate;
   forming a first stressed layer having a first stress located over the first transistor and a second stressed layer having a second stress different from the first stress and located over the first transistor and the second transistor, said second stressed layer having a deposited thickness over the second transistor, and where the first stressed layer and the second stressed layer abut and overlap each other in an area between the first and second transistors and defining an overlap area having an overlap thickness, said overlap area is located above an isolation structure; and sputter etching said second stressed layer to provide an etched second stressed layer that has an etched thickness over the second transistor that is less than said deposited thickness, and said etched second stressed layer over said second transistor has tapered surface sidewalls that meet each other, and wherein said overlap thickness has been reduced and said etched second stressed layer in said overlap area has tapered surface sidewalls that meet each other.

2. The method of claim 1 further comprising forming a stressed neutral layer atop at least the etched second stressed layer.

3. The method of claim 1 further comprising forming an interlevel dielectric having contact vias located therein atop said semiconductor substrate, said first stressed layer, and said etched second stressed layer.

4. The method of claim 1 wherein said sputter etching is performed in a plasma comprising an inert gas and nitrogen.

5. The method of claim 1 wherein said sputter etching is performed at a plasma power from about 800 to about 3000 Watts.

6. A method of forming a semiconductor structure comprising:

forming a first transistor of a first polarity laterally separated from a second transistor of a second polarity different from the first polarity over a semiconductor substrate, wherein at least one dummy gate is located on a surface of an isolation region in said substrate between said first and second transistors;

forming a first stressed layer having a first stress located over the first transistor and a second stressed layer having a second stress different from the first stress located over the first stressed layer and the second transistor, said second stressed layer having a deposited thickness over the second transistor, where the first stressed layer and the second stressed layer abut and overlap each other in an area between the first and second transistors defining an overlap area having an overlap thickness; and sputter etching said second stressed layer to provide an etched second stressed layer having an etched thickness that is less than said deposited thickness over the second transistor and said etched second stressed layer over said second transistor has tapered surface sidewalls that meet each other, and wherein said overlap thickness has been reduced and said etched second stressed layer in said overlap area has tapered surface sidewalls that meet each other.

7. The method of claim 6 wherein said sputter etching is performed in a plasma comprising an inert gas and nitrogen.

8. The method of claim 6 wherein said sputter etching is performed at a plasma power from about 800 to about 3000 Watts.

9. The method of claim 6 further comprising forming a stressed neutral layer atop said first stress layer said second etch stressed layer.

10. The method of claim 6 further comprising forming an interlevel dielectric material having contact vias located therein atop said semiconductor substrate, said first stress layer and said second stressed layer.

11. The method of claim 6 wherein said tapered surface sidewalls over said first transistor meet each other forming an inverted V-shape.

12. The method of claim 6 wherein said tapered surface sidewalls over said second transistor meet each other forming an inverted V-shape.

13. The method of claim 6 wherein said tapered surface sidewalls over said overlap area meet each other forming an inverted V-shape.

* * * * *